United States Patent
Bharath et al.

(10) Patent No.: US 10,503,227 B2
(45) Date of Patent: *Dec. 10, 2019

(54) APPARATUS AND METHOD TO REDUCE POWER LOSSES IN AN INTEGRATED VOLTAGE REGULATOR

(71) Applicant: INTEL CORPORATION, Santa Clara, CA (US)

(72) Inventors: Krishna Bharath, Chandler, AZ (US); Srikrishnan Venkataraman, Bangalore (IN); William J. Lambert, Chandler, AZ (US); Michael J. Hill, Gilbert, AZ (US); Alexander Slepoy, Chandler, AZ (US); Dong Zhong, Chandler, AZ (US); Kaladhar Radhakrishnan, Gilbert, AZ (US); Hector A. Aguirre Diaz, Guadalaraja (MX); Jonathan P. Douglas, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/695,947

(22) Filed: Sep. 5, 2017

(65) Prior Publication Data
US 2018/0101207 A1    Apr. 12, 2018

Related U.S. Application Data

(63) Continuation of application No. 14/836,780, filed on Aug. 26, 2015, now Pat. No. 9,753,510.

(51) Int. Cl.
    *G06F 1/26*       (2006.01)
    *G06F 1/3203*    (2019.01)
(Continued)

(52) U.S. Cl.
    CPC .............. *G06F 1/26* (2013.01); *G06F 1/3203* (2013.01); *H01L 23/645* (2013.01); *H02J 1/00* (2013.01);
(Continued)

(58) Field of Classification Search
    None
    See application file for complete search history.

(56) References Cited

U.S. PATENT DOCUMENTS 6,703,812 B1   3/2004   Lethellier
8,716,991 B1   5/2014   Ikriannikov
(Continued)

FOREIGN PATENT DOCUMENTS

JP    08293571     11/1996
JP    2004200612   7/2005
(Continued)

OTHER PUBLICATIONS

International Search Report and Written Opinion, dated Oct. 21, 2016, for PCT Patent Application No. PCT/US16/43183.
(Continued)

*Primary Examiner* — Paul B Yanchus, III
(74) *Attorney, Agent, or Firm* — Green, Howard, Mughal LLP

(57) ABSTRACT

Described is an apparatus which comprises: a first voltage regulator (VR) coupled to first one or more inductors, the first VR is to provide power to a first power domain; and a second VR coupled to second one or more inductors at least one of which is inductively coupled to at least one of the first one or more inductors, the second VR is to provide power to a second power domain separate from the first power domain, wherein there is a non-zero phase angle offset between switching transistors of the first VR relative to the second VR.

20 Claims, 11 Drawing Sheets

(51) Int. Cl.
*H02J 1/00* (2006.01)
*H02M 3/158* (2006.01)
*H01L 23/64* (2006.01)
*H02M 1/14* (2006.01)
*H02M 1/00* (2006.01)

(52) U.S. Cl.
CPC ............ *H02M 1/14* (2013.01); *H02M 3/158* (2013.01); *H02M 3/1584* (2013.01); *H02M 2001/008* (2013.01); *H02M 2003/1586* (2013.01)

(56) References Cited

U.S. PATENT DOCUMENTS

| | | | |
|---|---|---|---|
| 9,753,510 B2* | 9/2017 | Bharath | ............ H02M 3/1584 |
| 2004/0025065 A1 | 2/2004 | Lou | |
| 2008/0001698 A1 | 1/2008 | Hazucha et al. | |
| 2008/0002380 A1 | 1/2008 | Hazucha et al. | |
| 2009/0249092 A1 | 10/2009 | Lam et al. | |
| 2009/0256535 A1 | 10/2009 | Houston et al. | |
| 2012/0329509 A1 | 12/2012 | Ravichandran et al. | |
| 2013/0187463 A1 | 7/2013 | Lin | |
| 2014/0191738 A1 | 7/2014 | Xiao et al. | |
| 2014/0344600 A1 | 11/2014 | Breen et al. | |
| 2015/0222179 A1 | 8/2015 | Yun et al. | |

FOREIGN PATENT DOCUMENTS

| | | |
|---|---|---|
| WO | 2015101594 | 7/2015 |
| WO | 2015113599 | 8/2015 |

OTHER PUBLICATIONS

Non-Final Office Action, dated Nov. 4, 2016, for U.S. Appl. No. 14/836,780.
Notice of Allowance for U.S. Appl. No. 14/836,780, dated May 18, 2017.
International Preliminary Report on Patentability for International Patent Application No. PCT/US16/43183, dated Mar. 8, 2018.
Extended European Search Report dated Mar. 26, 2019 for EP Patent Application No. 16839772.7.
Ikriannikov, A. et al., "Magnetically Coupled Buck Converters", 2013 IEEE Energy Conversion Congress and Exposition. Sep. 15, 2013, pp. 4948-4954. XP032516355. DOI: 10.1109/ECCE.2013.6647368.

* cited by examiner

APPARATUS AND METHOD TO REDUCE POWER LOSSES IN AN INTEGRATED VOLTAGE REGULATOR

CLAIM OF PRIORITY

This United States continuation patent application is related to, and claims priority to, U.S. patent application Ser. No. 14/836,780 entitled "APPARATUS AND METHOD TO REDUCE POWER LOSSES IN AN INTEGRATED VOLTAGE REGULATOR," filed Aug. 26, 2015, which issues as U.S. Pat. No. 9,753,510 on Sep. 5, 2017, the entire contents of which are incorporated herein by reference.

BACKGROUND

As circuits on die scale with Moore's law, which predicts the number of transistors in a chip to double in about every two years, the passives such as inductors (also referred to as coils or reactors) used by products employing Voltage Regulators (VRs) similarly need to scale in tandem. An inductor is a passive two-terminal component which resists changes in electric current passing through it. When an electric current flows through the inductor, energy is temporarily stored in a magnetic field in the inductor. As the electric current through the inductor changes, the time-varying magnetic field induces a voltage in the inductor which opposes the change in current that created it.

The scaling of the inductors reduces the quality factor of the inductors, leading to efficiency loss. The quality factor (or Q factor) of an inductor is the ratio of its inductive reactance to its resistance at a given frequency, and is a measure of its efficiency. The series resistance of an inductor converts electric current through its coils into heat, thus causing a loss of inductive quality.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

With reference to inductors, scaling reduces the distance between the inductors, causing inductive coupling between distinct VR power domains, which also leads to efficiency loss.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
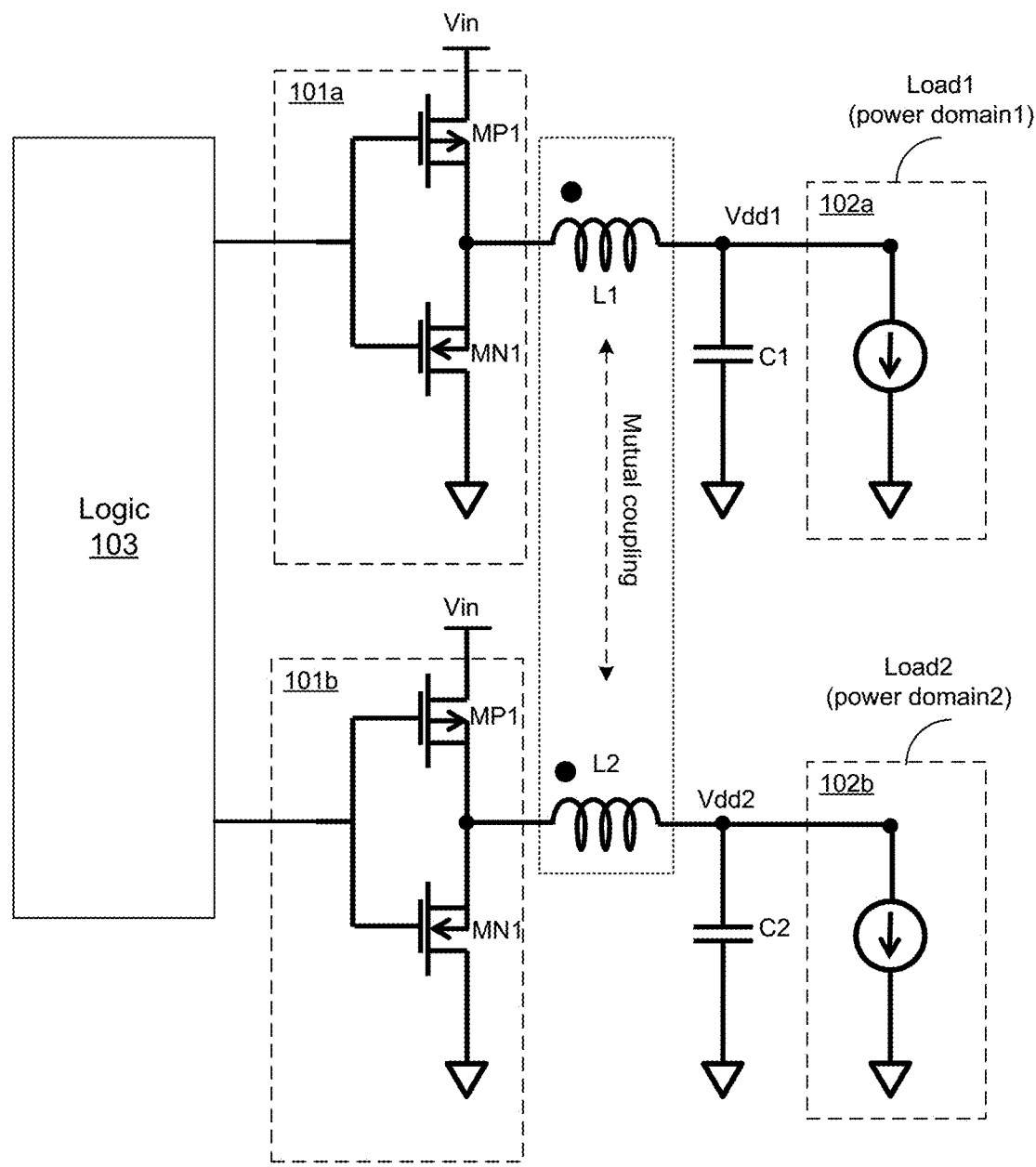
FIG. 1 illustrates a schematic of integrated voltage regulator (VR) domains with domain-to-domain coupling where the integrated VRs are operable to reduce power losses in the integrated VRs, according to some embodiments of the disclosure.

As inductors shrink in size to keep pace with circuit scaling, they also become more densely packed with other inductors from neighboring voltage regulator (VR) domains. A VR domain is a logical area of a chip that is provided power by the VR. Each VR domain (or power domain) may have a corresponding VR, in accordance with some embodiments. For example, a processor core is a VR domain and is provided power by its dedicated VR. In some embodiments, the inductors are positioned next to their VR domain. For example, inductors are positioned in a package above or below their respective domains in silicon.

Scaling results in increased coupling between the domains (also referred to here as a power domain). Both scaling and stray coupling can lead to increased power losses and reduced VR efficiency. Various embodiments describe an apparatus and method to improve VR efficiency and scalability for distinct VRs that are inductively coupled. In some embodiments, the quality factor of the inductors is improved by overlapping the inductors and intentionally coupling an inductor with adjacent inductor(s), but in distinct domain. For example, an inductor of one domain operating on Vdd1 power supply is allowed to couple intentionally with an inductor of another domain operating on Vdd2 power supply, where Vdd1 and Vdd2 are independent power supplies with independent power supply distribution networks.

In some embodiments, an apparatus is provided which comprises a first VR coupled to first one or more inductors, where the first VR is to provide power to a first power domain (e.g., processor core-1 operating on Vdd1 power supply). In some embodiments, the apparatus further comprises a second VR coupled to second one or more inductors at least one of which is inductively coupled to at least one of the first one or more inductors, where the second VR is to provide power to a second power domain separate from the first power domain. For example, processor core-2 operating on Vdd2 power supply domain which is separate from the Vdd1 power domain. In some embodiments, a non-zero phase angle offset is established between switching transistors of the first VR relative to the second VR.

In some embodiments, coupling between inductors of distinct domains is controlled by optimizing the phase angles (in pre-silicon and/or during run-time) of the VR phases both within and across domains. VR phases within the VR refer to multi-phase VRs that provide power supply (e.g., Vdd1) using multiple phases. VR phases across domains refers to phase difference between the phases of distinct power domains.

For example, phase difference between VR providing Vdd1 power supply and VR providing Vdd2 power supply are two different phases across domains. Here, optimizing generally refers to determining the phase of the switching clock for the VR that results in improving VR efficiency. As such, power losses across the entire system are reduced. Other technical effects will be evident from various embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates schematic 100 of integrated VR domains with domain-to-domain coupling where the integrated VRs are operable to reduce power losses in the integrated VRs, according to some embodiments of the disclosure.

Schematic 100 is part of a chip (e.g., processor) having multiple VRs with corresponding loads (i.e., power domains) and logic to control the multiple VRs, in accordance with some embodiments. A such, the VRs are integrated VRs that are implemented on-die and provide power to on-die load(s). So as not to obscure the embodiments, two VR power domains with two VRs are shown that drive into two inductors. However, the embodiments are not limited to two VR domains, two VRs, and two inductors, and are applicable to any number of VR domains, VRs, and inductors.

Various embodiments describe VRs with reference to switching buck regulators. A buck regulator is a voltage step down and current step up converter. Switching buck regulators rapidly switch a series device on and off. The duty cycle of the switch sets how much charge is transferred to the load. However, the embodiments are not limited to switching buck regulators. Other types of regulators such as DC-DC converters (e.g., switching boost regulators), linear regulators (e.g., low-dropout regulators (LDOs)), Zener controlled transistor voltage regulators, discrete transistor voltage regulators, may be used.

In some embodiments, the processor comprises VR 101a, Load 102a, VR 101b, Load 102b, and Logic 103. In this example, VR 101a is a single phase VR that provides power to Load1 102a (e.g., a power domain such as a first processor core operating on Vdd1 power supply) via inductor L1 and capacitor C1. VR 101b is also a single phase VR which provides power to Load2 102b (e.g., another power domain such as a second processor core) via inductor L2 and capacitor C2. However, the embodiments are not limited to single-phase VRs. VRs can have multiple phases with multiple inductors, and all such variations are within the scope of the various embodiments. So as not to obscure the embodiments, only the high-side p-type switch MP1 and low side n-type switch MN1 of VRs 101a/b are shown. However, a person skilled in the art would appreciate that other components such as controller(s) for controlling the feedback mechanism of the VRs may be needed for a fully functioning switching VR.

In this example, the output voltage provided by VR 101a to Load1 102a is Vdd1 while the output voltage provided by VR 101b to Load2 102b is Vdd2. In some embodiments, Vdd1 and Vdd2 may be independent power supplies having their own power supply distributions (i.e., Vdd1 and Vdd2 power supplies are not physically coupled).

As inductors shrink to keep pace with circuit scaling, they also become more densely packed with other inductors from neighboring VR domains. In this example, inductors L1 and L2 may be close to one another (e.g., abutting one another) as a side effect of scaling. As such, inductors L1 and L2 may be mutually coupled by mutual inductance. Mutual inductance occurs when a change in current in one inductor induces a voltage in another nearby inductor. This mutual coupling of inductors L1 and L2 in effect couple the two distinct power domains operating on Vdd1 and Vdd2, respectively. This domain-to-domain coupling can lower the efficiency of the two VRs by lowering the Q factor of inductors L1 and L2.

In some embodiments, Logic 103 is provided to adjust the phase of the switching clocks that controls the switching times of transistors MP1 and MN1 such that the switching phase of VR 101a is different from the switching phase of VR 101b. For example, Logic 103 introduces a non-zero phase offset (e.g., phase offset of 180°) between the switching phases of VR 101a and VR 101b. As such, efficiency of the two VRs improves by reducing power losses. In some embodiments, Logic 103 introduces a non-zero phase offset between every neighboring VR. The non-zero phase offset is also referred to as the base offset. In some embodiments, Logic 103 introduces a non-zero phase offset during runtime according to the operating conditions of the VRs. For example, VR1 101a may be generating Vdd1 of 0.9V while VR2 101b may be generating Vdd2 of 0.7V.

Figure 2:
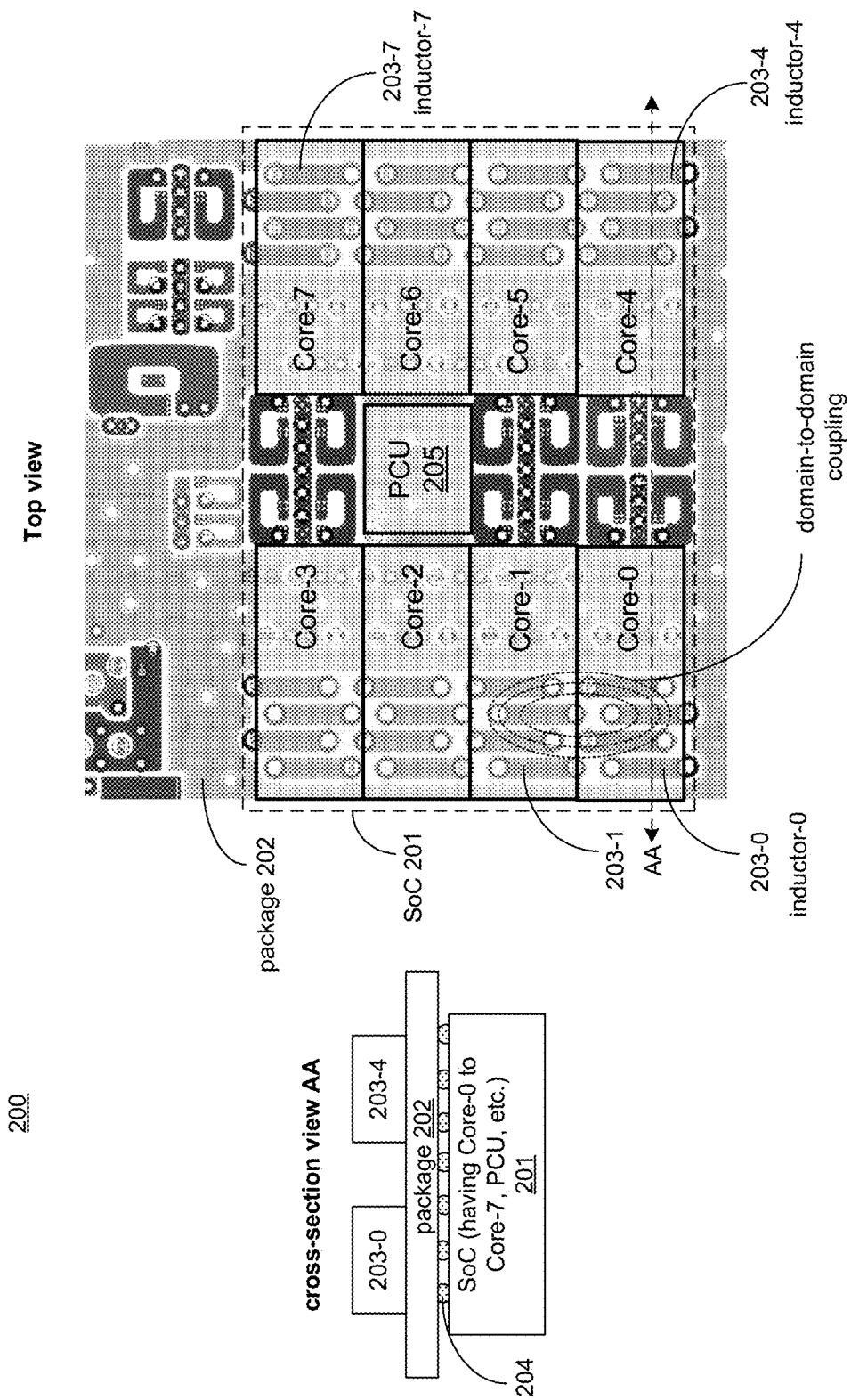
FIG. 2 illustrates a chip having multiple processing cores with their corresponding integrated VRs which are operable to reduce power losses in the integrated VRs, according to some embodiments of the disclosure.

FIG. 2 illustrates chip 200 having multiple processing cores with their corresponding integrated VRs which are operable to reduce power losses in the integrated VRs, according to some embodiments of the disclosure. It is pointed out that those elements of FIG. 2 having the same reference numbers (or names) as the elements of any other figure can operate or function in any manner similar to that described, but are not limited to such.

In some embodiments, a processor or system-on-chip (SoC) 201 having multiple processing cores (e.g., Core-0 to Core-7) are provided with independent power supplies from VRs associated with the processing cores, as shown by the top view. A cross-section AA of the top view is shown on the left hand side of FIG. 2. SoC 201 is coupled to package 202, and the inductors 203-0 to 203-7 are positioned on package 202. Package 202 is coupled to SoC 201 via bumps 204. In some embodiments, inductors 203-0 to 203-7 are Air Core Inductors (ACIs). In other embodiments, other types of inductors may be used for inductors 203-0 to 203-7. For example, inductors 203-0 to 203-7 are Magnetic Core Inductors (MCIs).

In some embodiments, inductors 203-0 to 203-7 may be mutually coupled. For example, neighboring inductors 203-0 and 203-1 are mutually coupled as such there is domain-to-domain coupling between the distinct domains of Core-1 and Core-2. There is also domain-to-domain coupling between Core-4 and Core-0, but it may be weaker than the stronger domain-to-domain coupling between Core-0 and Core-1 due to the distances between the respective inductors.

In some embodiments, Logic 103 is implemented as a power control unit (PCU) 205 (which is part of SoC 201). In some embodiments, PCU 205 adjusts the phases of the switching clocks that control the switching times of transistors MP1 and MN1 such that the switching phase of the VR of Core-0 is different from the switching phase of the VR of Core-1. For example, PCU 205 introduces a non-zero phase offset (e.g., phase offset of 180°) between the switching phases of the VR of Core-0 and the VR of Core-1. As such, the efficiency of the two VRs improves by reducing power losses.

While the embodiments are described with reference to a SoC having the VRs on die and inductors on the package, the embodiments are not limited to such. For example, in some embodiments, the integrated VR can be on a separate chip that is on the same package as the logic chip. In another example, the VRs and the corresponding inductors can be on the motherboard.

Figure 3A:
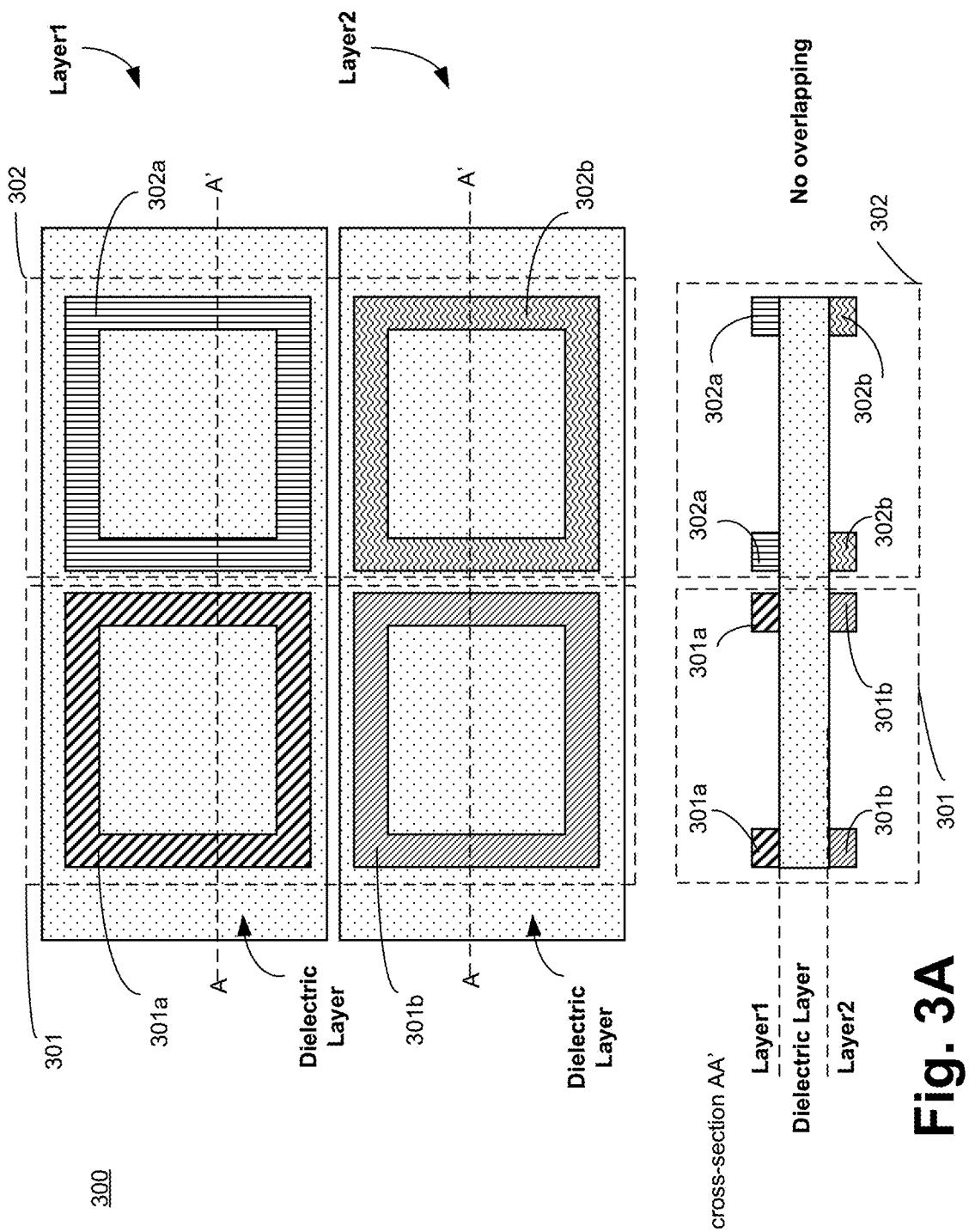
FIG. 3A illustrates a pair of un-overlapped inductors of two integrated VRs which are operable to reduce power losses in the integrated VRs, according to some embodiments of the disclosure.

FIG. 3A illustrates pair 300 of un-overlapping inductors 301 (i.e., 301a/b) and 302 (i.e., 302a/b) of two integrated VRs which are operable to reduce power losses in the integrated VRs, according to some embodiments of the disclosure. It is pointed out that those elements of FIG. 3A having the same reference numbers (or names) as the elements of any other figure can operate or function in any manner similar to that described, but are not limited to such.

Inductor 301 (i.e., 301a/b) and inductor 302 (i.e., 302a/b) are formed in two layers—Layer1 and Layer2, where Layer1 and Layer2 are separated by a Dielectric Layer. Layer1 here shows a first part of two inductors 301a and 302a while Layer2 shows a second part of the two inductors 301b and 302b. In this example, the inductors 301 and 302 are not interleaved with one another. Here, interleaving generally refers to having parts of one inductor within the area domain or zone of another inductor. However, inductors 301 and 302 may experience mutual inductive coupling even though the inductors are not overlapping each other. In some embodiments, the switching current provided to inductor 301 is out of phase relative to the switching current provided to inductor 302.

Figure 3B:
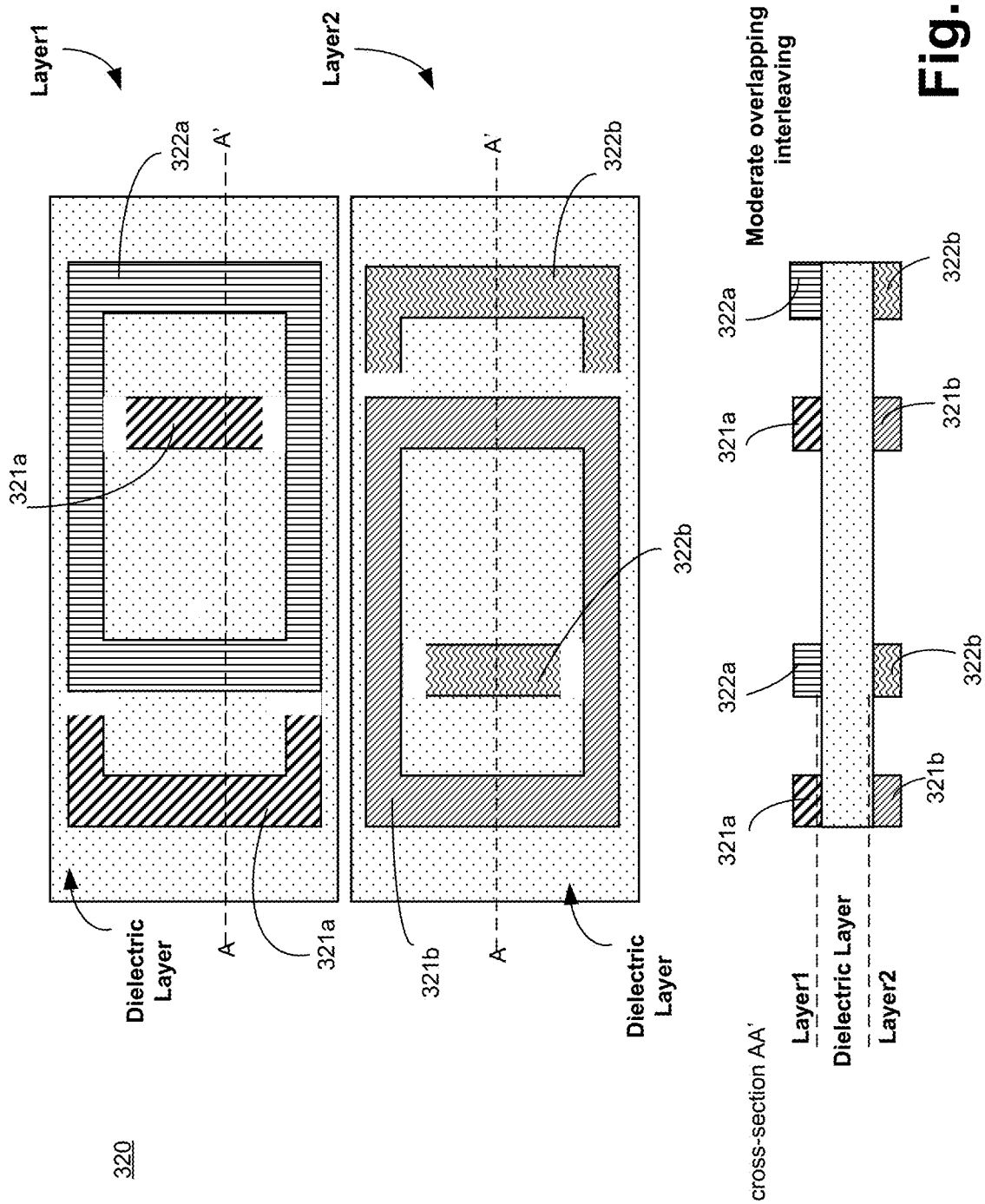
FIG. 3B illustrates a pair of partially overlapped inductors of two integrated VRs which are operable to reduce power losses in the integrated VRs, according to some embodiments of the disclosure.

FIG. 3B illustrates pair 320 of partially overlapped inductors 321 (i.e., 321a/b) and 322 (i.e., 322a/b) of two distinct integrated VRs which are operable to reduce power losses in the integrated VRs, according to some embodiments of the disclosure. It is pointed out that those elements of FIG. 3B having the same reference numbers (or names) as the elements of any other figure can operate or function in any manner similar to that described, but are not limited to such.

Inductor 321 (i.e., 321a/b) and inductor 322 (i.e., 322a/b) are formed in two layers—Layer1 and Layer2, where Layer1 and Layer2 are separated by a Dielectric Layer. Layer1 here shows a first part of two inductors 321a and 322a while Layer2 shows a second part of the two inductors 321b and 322b. In this example, the partially overlapped inductors 321 and 322 are interleaved and more inductively coupled (i.e., moderately coupled) than the un-overlapping inductors 301 and 302.

Figure 3C:
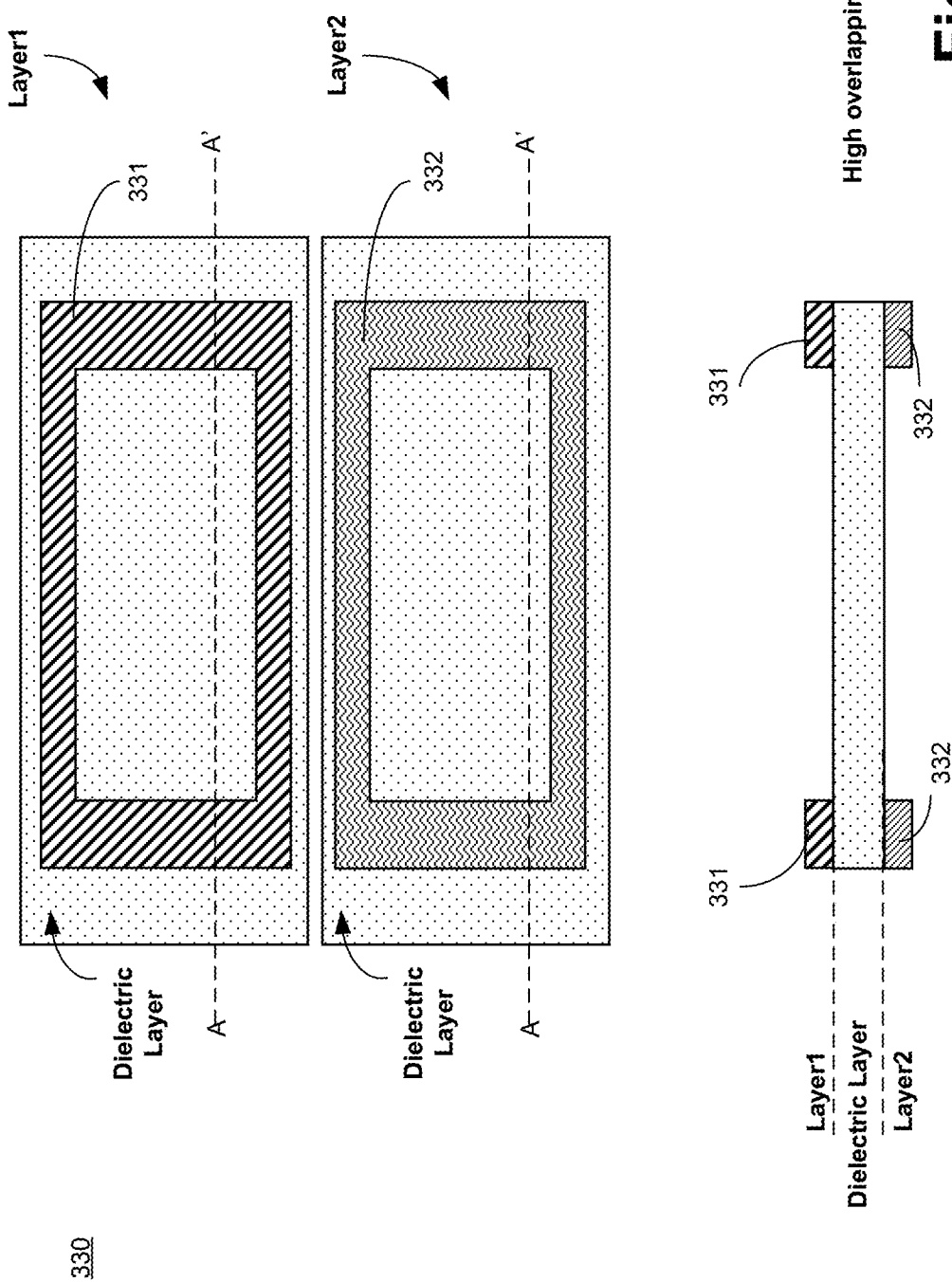
FIG. 3C illustrates a pair of highly overlapped inductors of two integrated VRs which are operable to reduce power losses in the integrated VRs, according to some embodiments of the disclosure.

FIG. 3C illustrates pair 330 of highly overlapped inductors 331 and 332 of two integrated VRs which are operable to reduce power losses in the integrated VRs, according to some embodiments of the disclosure. It is pointed out that those elements of FIG. 3C having the same reference numbers (or names) as the elements of any other figure can operate or function in any manner similar to that described, but are not limited to such. In this example, the highly overlapped inductors 331 and 332 are more inductively coupled (i.e., highly coupled) than the moderately coupled inductors 321 and 322.

Figure 4:
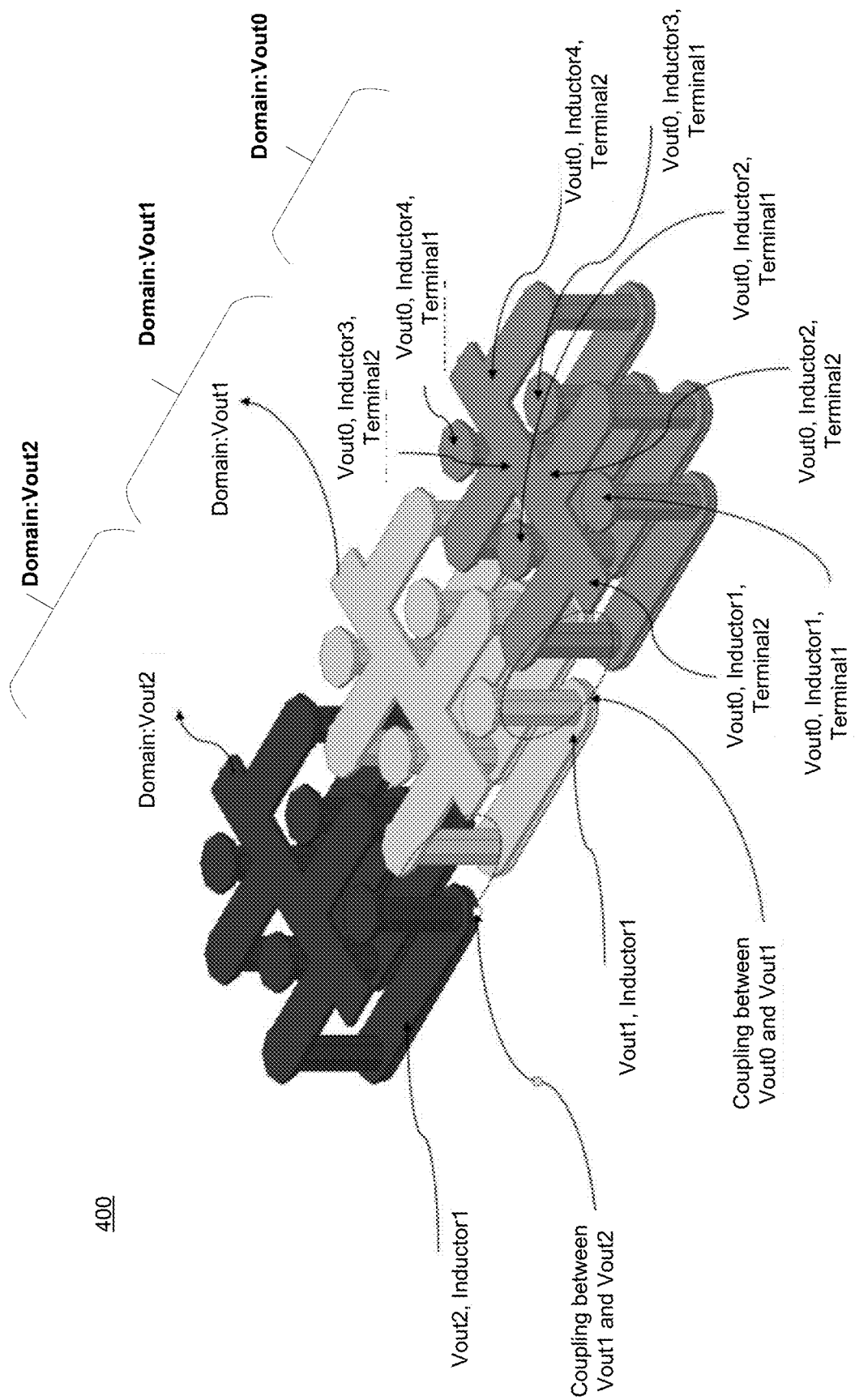
FIG. 4 illustrates a three dimensional (3D) view of Air Core Inductors (ACIs), according to some embodiments of the disclosure.

FIG. 4 illustrates three dimensional (3D) view 400 of ACIs in a 4-phase VR system, where each VR has 4 inductors, according to some embodiments of the disclosure. It is pointed out that those elements of FIG. 4 having the same reference numbers (or names) as the elements of any other figure can operate or function in any manner similar to that described, but are not limited to such.

In some embodiments, each set of inductors associated with a power domain is positioned in package 202 such that the set of inductors is above the power domain. In this example, each VR is a 4-phase VR, such that each VR has four ACIs. In other embodiments other number of phases per VR may be used.

In some embodiments, a first set of inductors (e.g., inductor1, inductor2, inductor3, inductor4) for domain Vout0 is positioned above Core-0 and one of terminal of each inductor of the set (e.g., terminal 1) is coupled to a VR Driver while the other terminal (i.e., terminal 2) is coupled to the load (e.g., power delivery network providing power to Core-0).

In some embodiments, a second set of inductors (e.g., inductor1, inductor2, inductor3, inductor4) for domain Vout1 is positioned above Core-1 and one of terminal of each inductor of the set (e.g., terminal 1) is coupled to a VR Driver while the other terminal (i.e., terminal 2) is coupled to the load (e.g., power delivery network providing power to Core-1).

In some embodiments, a third set of inductors (e.g., inductor1, inductor2, inductor3, inductor4) for domain Vout2 is positioned above Core-2 and one of terminal of each inductor of the set (e.g., terminal 1) is coupled to a VR Driver while the other terminal (i.e., terminal 2) is coupled to the load (e.g., power delivery network providing power to Core-2).

The 3D view 400 also illustrates the ACIs that form the set of inductors and the coupling between power domains. Here, the inductors of a set are partially interleaved with inductors of another set. FIG. 4 also illustrates the coupling between power domains. For example, coupling between Vout0 and Vou1, and coupling between Vou1 and Vou2 are illustrated.

Figure 5:
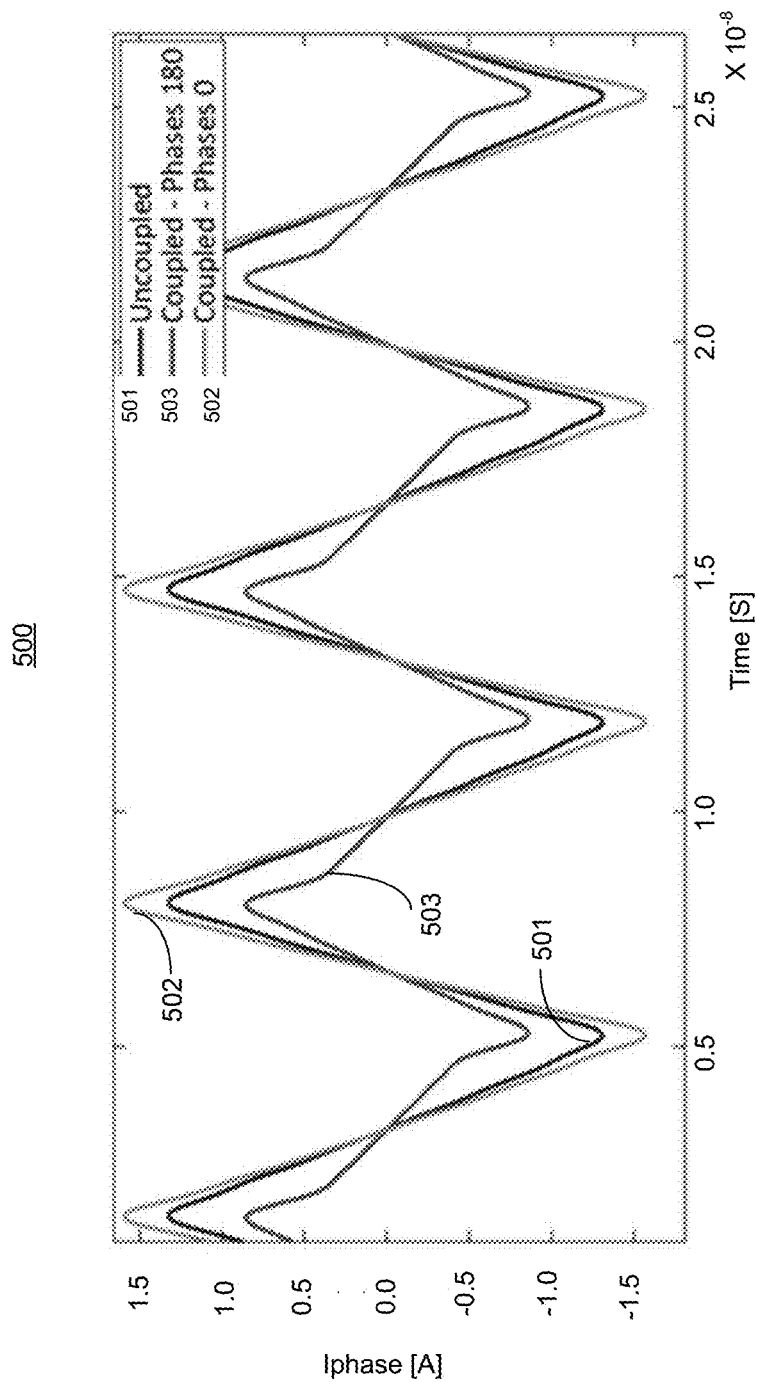
FIG. 5 illustrates a plot showing inductor ripple currents with and without domain-to-domain coupling, in accordance with some embodiments of the disclosure.

FIG. 5 illustrates plot 500 showing inductor ripple currents with and without domain-to-domain coupling, in accordance with some embodiments of the disclosure. It is pointed out that those elements of FIG. 5 having the same reference numbers (or names) as the elements of any other figure can operate or function in any manner similar to that described, but are not limited to such. Here, x-axis is time in seconds (s) and y-axis is phase current in Ampere (A) representing ripple current.

Here, three waveforms are shown—501, 502, and 503. Waveform 501 illustrates the case when the power domains are not coupled (i.e., the inductors of the neighboring VRs are so far apart in distance that there is negligible or no inductive coupling). Waveform 502 illustrates the case when the power domains are coupled (i.e., the inductors of the neighboring VRs are inductively coupled by mutual inductance (e.g., FIG. 3A) or by partial or full overlapping of inductors of different power domains (e.g., FIGS. 3B-C)). In the case of waveform 502, the VRs switch in-phase (i.e., the phase offset angle (or base offset angle) is 0 degrees or in-phase relative to the phase angles of the two VRs). Waveform 502 has higher ripple current than waveform 501 because of the coupling of the power domains.

Waveform 503 illustrates the case when the power domains are coupled (i.e., the inductors of the neighboring VRs are inductively coupled by mutual inductance (e.g., FIG. 3A) or by partial or full overlapping of inductors of different power domains (e.g., FIGS. 3B-C)). In this case, the VRs switch out-of-phase (i.e., the phase offset angle of one VR is 180 degrees or out-of-phase relative to the phase angle of the other VR) which results in lower ripple current compared to ripple currents of waveforms 501 and 502.

In some embodiments, Logic 103 provides a non-zero phase offset angle to reduce ripple current in the neighboring inductors of two different and distinct power domains. In some embodiments, these power domains can be completely independent of each other (i.e., they have their own controllers and own feedback mechanisms, and may provide different power levels to their respective power domains).

Table 1 shows the impact of introducing non-zero phase offset (or base offset) between two distinct VRs that have coupled power domains through inductive/mutual coupling.

TABLE 1

| Topology | L11 (nH) | L12 (nH) | Rac at 147 MHz (mOhms) | Rdc (mOhms) | No Load ACI Power Loss mV at 150 MHz Vin = 1.7, Vout1 = Vout2 = 0.7 V |
|---|---|---|---|---|---|
| Uncoupled - 1 Turn | 1.08 | ~0 | 58 | 12 | 77.8 |
| Coupled - 1 Turn, Phases 180 | 1.32 | −0.46 | 72 | 16 | 40.4 |

The first row is the data associated with uncoupled domains with un-overlapped inductors (i.e., with approximately zero mutual inductance added to inductor L1 from inductor L2). In this example, with reference to FIG. 1, by introducing phase offset of 180° between VR1 101a and VR2 101b, power loss significantly reduces.

Figure 6:
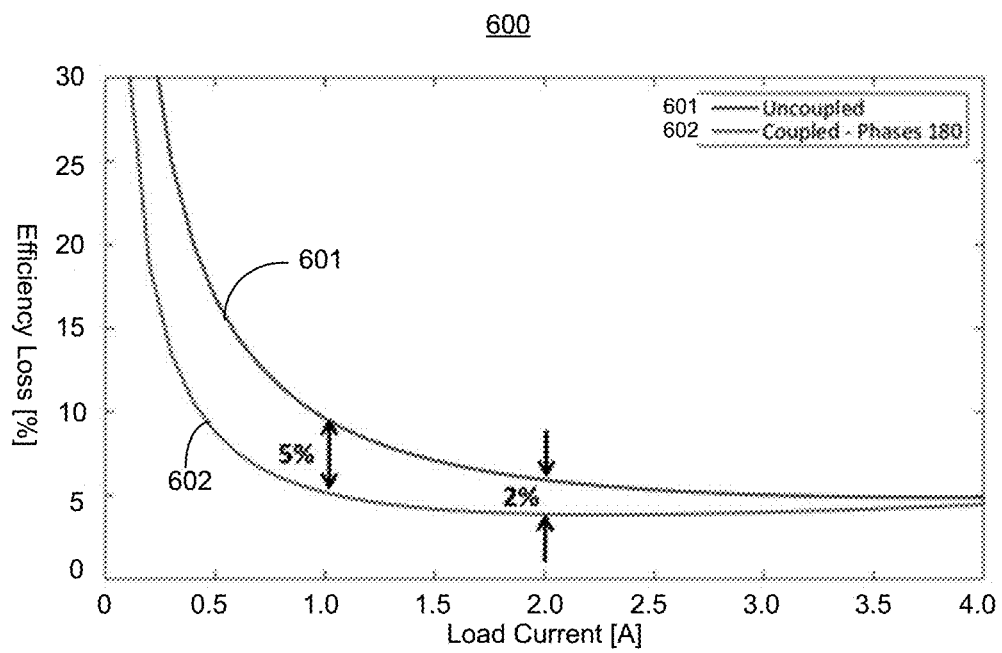
FIG. 6 illustrates a plot showing efficiency loss vs. load current with and without domain-to-domain coupling, in accordance with some embodiments of the disclosure.

For example, peak-to-peak value of ripple current reduces by 46% when the two power domains of Vout1 and Vout2 are switched 180° out of phase as opposed to when they are switched in phase. Here, power loss reduces from 77.8mW to 40.4mW at 150 MHz switching frequency when Vin is 1.7V and Vout1 and Vout2 are 0.7V. Lower power loss means better Q-factor for the inductors. Here, L11 is the self-inductance in nano Henry (nH) of L1, L12 is the mutual inductance added to L1 from L2, Rdc is the DC (low frequency) resistance, Rac (high frequency) is the AC resistance at 147 MHz. An electromagnetic phenomenon called "skin effect" causes the resistance of a conductor to vary as a function of the frequency FIG. 6 illustrates plot 600 showing efficiency loss vs. load current with and without domain-to-domain coupling, in accordance with some embodiments of the disclosure. It is pointed out that those elements of FIG. 6 having the same reference numbers (or names) as the elements of any other figure can operate or function in any manner similar to that described, but are not limited to such. Here, x-axis is load current and y-axis is efficiency loss. Efficiency loss generally refers to the ratio of the power dissipated in the elements of the regulator (including the inductor) to the total input power. Plot 600 shows that the light load power loss in the coupled case is 48% lower than the uncoupled configuration, leading to an improvement of 1-5% in the combined efficiency of both power domains.

Waveform 601 illustrates the efficiency loss of the uncoupled case where the power domains are uncoupled and there is no overlapping of inductors associated with the power domains. Waveform 602 illustrates the efficiency loss of the coupled case with phase offset of 180° between switching clocks of the VRs. In this case, the power domains are coupled and there may be overlapping of inductors associated with the power domains. Waveform 602 shows 2-5% improvement in efficiency loss between the uncoupled case (i.e., waveform 601) and the coupled case with phase offset (i.e., waveform 602).

Figure 7:
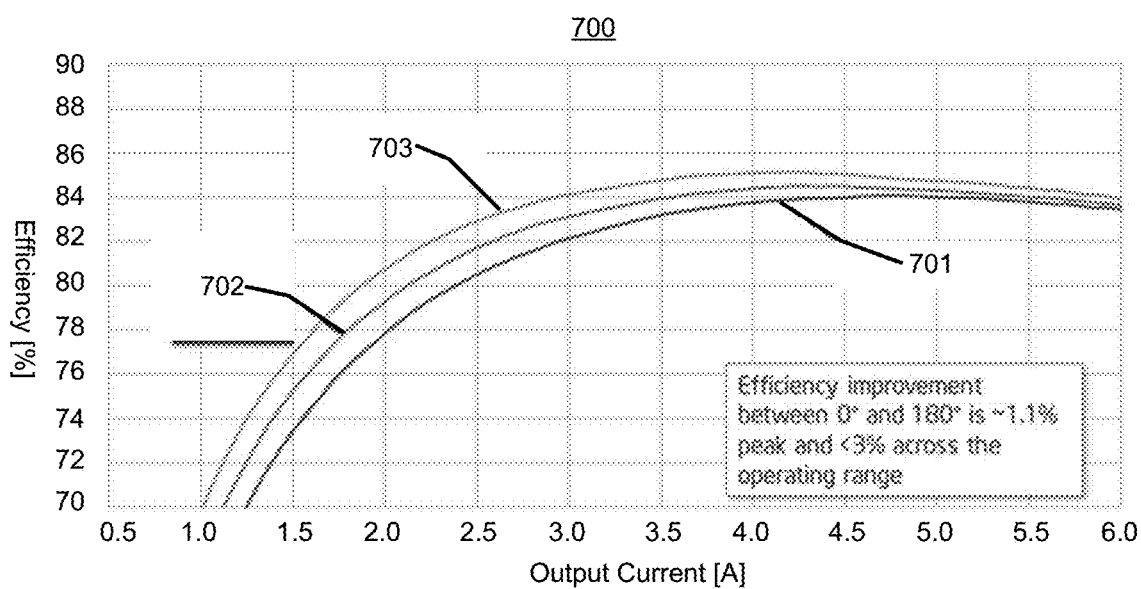
FIG. 7 illustrates a plot showing efficiency vs. load current with and without domain-to-domain coupling, in accordance with some embodiments of the disclosure.

FIG. 7 illustrates plot 700 showing efficiency vs. load current with and without domain-to-domain coupling, in accordance with some embodiments of the disclosure. It is pointed out that those elements of FIG. 7 having the same reference numbers (or names) as the elements of any other figure can operate or function in any manner similar to that described, but are not limited to such. Here, x-axis is output current in A while y-axis is Efficiency.

Here, with reference to FIG. 2, waveform 701 is the case when Core-2 phase offset relative to Core-1 is 0° (i.e., in-phase). Waveform 702 is the case when Core-1 is uncoupled from any other cores (e.g., when other cores are off and Core-1 is the only core operating). Waveform 703 is the case when Core-2 phase offset relative to Core-1 is 180° (i.e., the base offset between Core-2 and Core-1 is out of phase). Plot 700 demonstrates that coupling between distinct domains, as shown by waveform 703, can indeed be used to obtain real system level efficiency benefits of 1% to 3% across a useful operating range.

Figure 8:
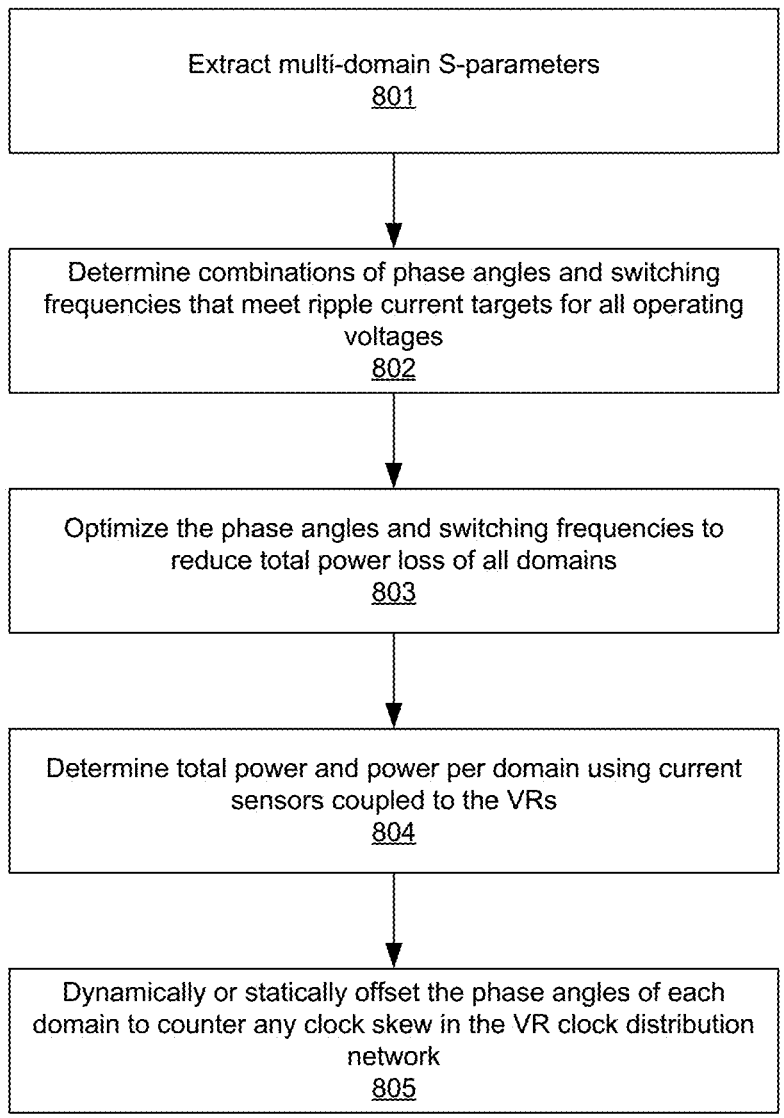
FIG. 8 illustrates a flowchart of a method for optimizing phase angles within and across domains to reduce power losses in the integrated VRs, in accordance with some embodiments.

FIG. 8 illustrates flowchart 800 of a method for optimizing phase angles within and across domains to reduce power losses in the integrated VRs, in accordance with some embodiments. It is pointed out that those elements of FIG. 8 having the same reference numbers (or names) as the elements of any other figure can operate or function in any manner similar to that described, but are not limited to such.

Although the blocks in the flowchart with reference to FIG. 8 are shown in a particular order, the order of the actions can be modified. Thus, the illustrated embodiments can be performed in a different order, and some actions/blocks may be performed in parallel. Some of the blocks and/or operations listed in FIG. 8 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 801, S-parameters (or Scattering parameters) are extracted for all distinct power domains that are coupled by inductive coupling (e.g., mutual inductance coupling and/or via physical overlapping of inductors). S-parameters describe the electrical behavior of linear electrical networks when the linear electrical networks undergoes different steady state stimuli by electrical signals. As such, a comprehensive database (or matrix) of coupled domains is established indicating the strengths of coupling between various domains.

With reference to FIG. 2, strong and weak domain-to-domain coupling exists between various power domains. For example, the domain-to-domain coupling between inductors 203-0 and 203-7 is weaker than the domain-to-domain coupling between inductors 203-0 and 203-4, while the domain-to-domain coupling between inductors 203-0 and 203-1 is stronger than the domain-to-domain coupling between inductors 203-0 and 203-7 and inductors 203-0 and 203-4.

At block 802, all combinations of phase angles and switching frequencies that meet ripple voltage targets are determined at all required operating voltages. The ripple voltage is the small unwanted residual periodic variation of the DC output voltage of a power supply, and is typically in the range of 1-50 mV.

Different power domains may operate at different voltages. For example, Core-0 may operate at 1.0V while Core-1 may be in low power state and may operate at 0.6V (i.e., Vdd1=1.0V and Vdd2=0.6V). As such, inductive coupling between inductors 203-0 and 203-1 depends on the operating output voltages provided by the VRs of Core-0 and Core-1.

The VRs of Core-0 and Core-1 may also have different phase angles and switching frequencies for different requirements of operating output voltages. The phase angles and switching frequencies of the VRs of Core-0 and Core-1 may also be different because of ripple current targets. All these combinations of phase angles and switching frequencies for each VR is determined and tabulated as a look-up table, in accordance with some embodiments. In some embodiments, the look-up table is stored in a non-volatile memory and accessible by PCU 205.

At block 803, phase angles and switching frequencies that were determined at block 802 are optimized (i.e., adjusted) such that the total power loss for all domains (i.e., power loss for each VR associated with each power domain) is reduced or minimized. In some embodiments, given a set of parameters, such as input voltages, output voltages, switching frequency, output currents, and available phase angles, the power loss for the inductors belonging to each domain can be computed analytically, or via computer simulation, and the combination of the input parameters that provides the lowest total power is selected as the optimum. For example, phase angles and switching frequencies for Core-0 and Core-1 that provide the lowest power loss in their respective VRs are identified for various operating output voltage settings.

In some embodiments, these optimized phase angles and switching frequencies for each power domain is set by a controller (e.g., PCU 205) as the operating voltage settings change. In some embodiments, the optimized phase angles and switching frequencies for each power domain is programmed for each VR of the power domain by hardware (e.g., fuses) or software (e.g., operating system). In some embodiments, the optimized phase angles and switching frequencies for each power domain is set at runtime depending on the operating conditions of the processor or SoC 201. As such, at block 804, the current output from each VR of each power domain is sensed and total power for all domains and power per domain are determined.

At block 805, base offsets between distinct power domains are established using the runtime data of current obtained from current sensors and applied to the VRs of the various power domains. As such, base offsets between VRs of various cores of FIG. 2 are set dynamically as the processor is operating and as the operating conditions change. In some embodiments, the base offsets between power domains are updated periodically instead of dynamically. For example, the base offsets between power domains may be set every 10 ms.

In some embodiments, when current sensor data is not available for each power domain to provide runtime base offset adjustments, the optimized phase angles and switching frequencies obtained from block 803 can be used to statically set the base offsets (e.g., by fuses) between the various power domains. As such, various embodiments allow for pre-silicon, and/or at high-volume manufacturing time point, adjustment of base offsets between the distinct power domains.

The base offsets or phase offsets between the power domains can be adjusted to counter any clock skew between the VR clock distribution associated with the various power domains, in accordance with some embodiments. For example, if there is more clock skew in the clocks provided to VRs of Core-0 than the VRs of Core-1, then the phase or base offset can be adjusted (e.g., from 180° to 175°) to achieve the target low power loss and higher efficiency of the VRs.

Figure 9:
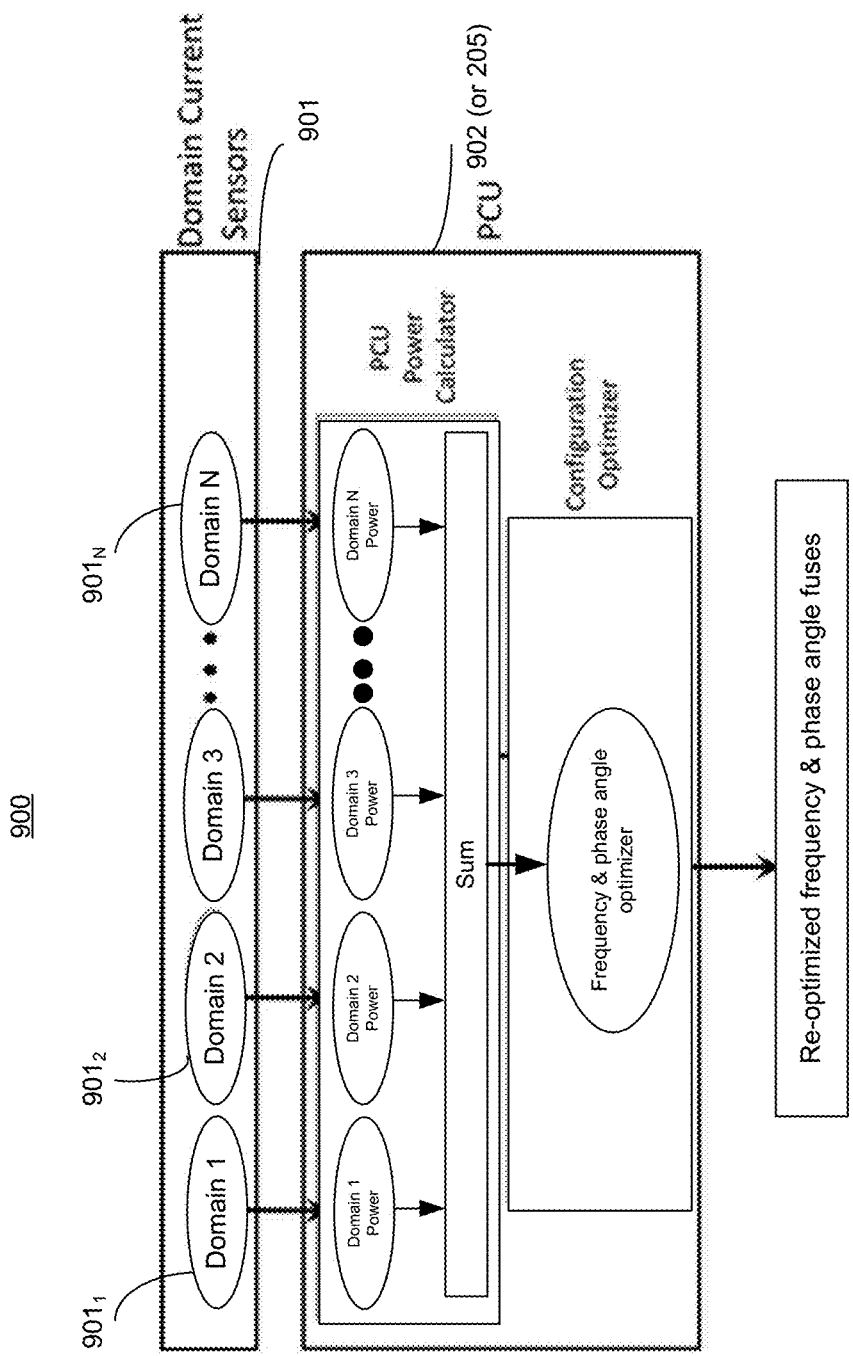
FIG. 9 illustrates a block diagram of an apparatus for reducing, at run-time, power losses in the integrated VRs, according to some embodiments.

FIG. 9 illustrates a block diagram of apparatus 900 for reducing at run-time power losses in the integrated VRs, according to some embodiments. It is pointed out that those elements of FIG. 9 having the same reference numbers (or names) as the elements of any other figure can operate or function in any manner similar to that described, but are not limited to such.

In some embodiments, apparatus 900 comprises current sensors $901_{1-N}$ (where 'N' is the number of VRs, power domains, or current sensors) embedded in each power domain to sense the current generated by the VR for the power domain. The current sensors are collectively identified as 901. For example, current sensor $901_1$ is provided to sense the output of VR1 that provides power to Core-0. In some embodiments, the currents sensed by the current sensors $901_{1-N}$ of all power domains is sensed and provided to controller 902 (e.g., PCU 205).

In some embodiments, controller 902 computes the per domain power by multiplying the current sensed by the respective power domain with the output voltage provided by the VR of that power domain. In some embodiments, controller 902 computes the total power of SoC 201 by summing the power data for each power domain using the sensed current data. In some embodiments, controller 902 uses the per domain power and total power computations to re-program the base offsets of the active power domains (as opposed to those power domain that are in deep sleep state) using the sensed data obtained at runtime and using the tabulated data obtained from block 802 of FIG. 8.

In some embodiments, controller 902 uses a frequency and phase angle optimizer to perform the method described with reference to FIG. 8 to determine base phase angle offset. In some embodiments, re-optimized frequency and phase angle offsets are used for reprogramming fuses. In some embodiments, the re-optimized frequency and phase angle offsets are used for improving VR efficiency. As such, real-time base offset adjustments between power domains is provided for reducing power loss and increasing VR efficiency while SoC 201 is operating.

Figure 10:
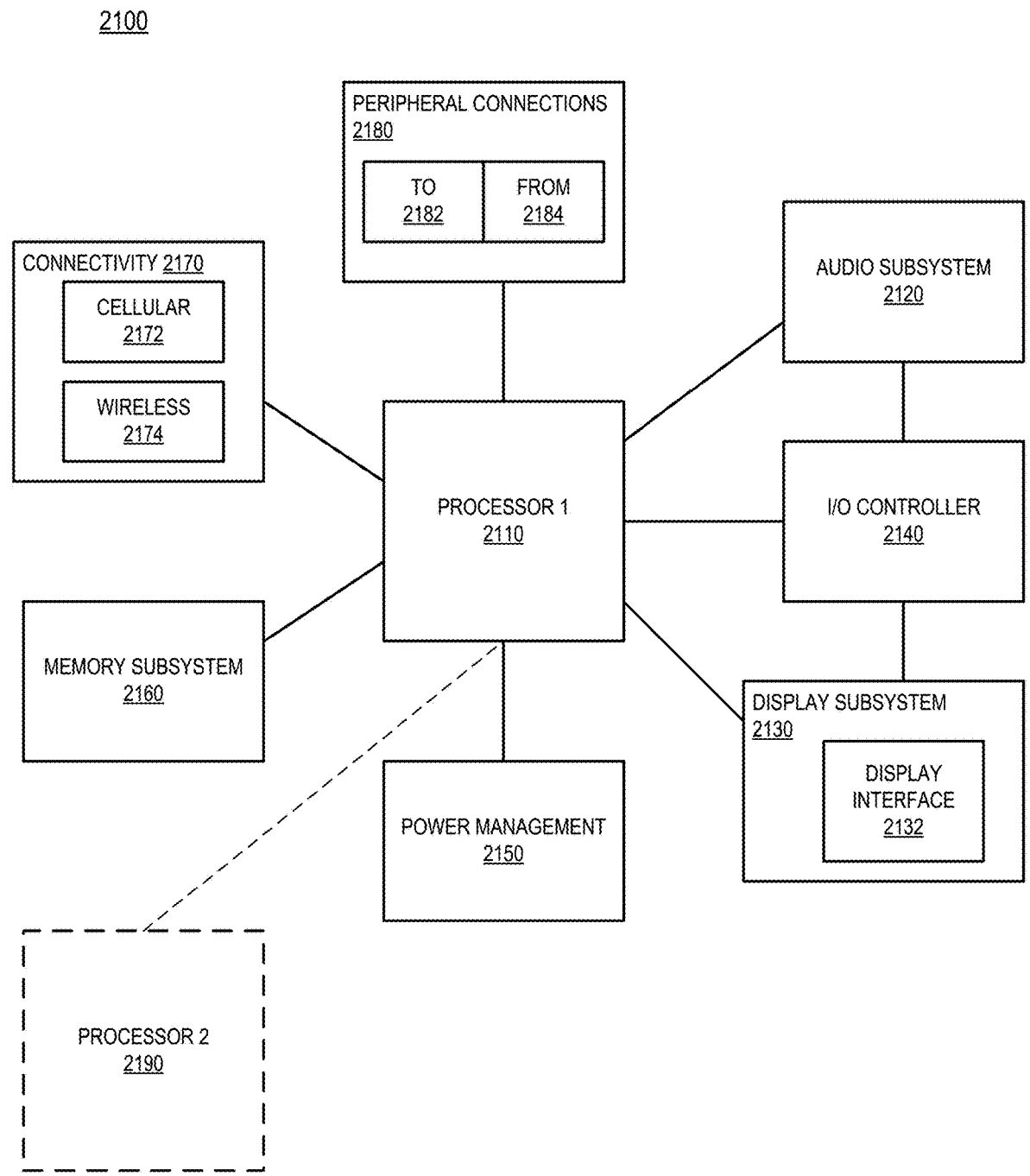
FIG. 10 illustrates a smart device or a computer system or a SoC (System-on-Chip) having apparatus to reduce power losses in the integrated VRs which are inductively coupled between distinct domains, according to some embodiments.

FIG. 10 illustrates a smart device or a computer system or a SoC having apparatus to reduce power losses in the integrated VRs, according to some embodiments. It is pointed out that those elements of FIG. 10 having the same reference numbers (or names) as the elements of any other figure can operate or function in any manner similar to that described, but are not limited to such.

FIG. 10 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 having apparatus to reduce power losses in the integrated VRs, according to some embodiments discussed. Other blocks of the computing device 2100 may also include apparatus to reduce power losses in the integrated VRs of some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus which comprises: a first voltage regulator (VR) coupled to first one or more inductors, the first VR is to provide power to a first power domain; and a second VR coupled to second one or more inductors at least one of which is inductively coupled to at least one of the first one or more inductors, the second VR is to provide power to a second power domain separate from the first power domain, wherein there is a non-zero phase angle offset between switching transistors of the first VR relative to the second VR.

In some embodiments, the apparatus comprises: a first current sensor to sense current of the first power domain; and a second current sensor to sense current of the second power domain. In some embodiments, the apparatus comprises a controller to calculate powers of the first and second domains, respectively, and total power of a chip having the first and second VRs. In some embodiments, the controller is to adjust the non-zero phase angle offset according to the powers of the first and second domains, respectively, and the total power.

In some embodiments, the controller is to adjust the non-zero phase angle offset according to the powers of the first and second domains, respectively, and the total power at runtime during operation of a chip having the first and second power domains. In some embodiments, the first one or more inductors are at least partially interleaved with the second one or more inductors. In some embodiments, the first and second one or more inductors are at least one of: air core inductors (ACIs); or magnetic code inductors (MCIs). In some embodiments, the first and second one or more inductors are positioned off-die in a package such that the first one or more inductors cover an area of the package which corresponds to an area of the first power domain. In some embodiments, the non-zero phase angle offset is 180°. In some embodiments, the non-zero phase angle offset is programmable. In some embodiments, the first and second VRs are at least one of single phase regulator or a multi-phase regulator.

In another example, a machine readable storage media having one or more instructions that when executed cause one or more processors to perform an operation comprising: extract S-parameters for a first power domain powered by a first voltage regulator (VR) coupled to first one or more inductors, and a second power domain powered by a second VR coupled to second one or more inductors, wherein at least one of the first and second one or more inductors are mutually coupled; determine, for at least two operating voltages of the first and second power domains, phase angle and switching frequency combinations that meet ripple current targets; and provide a non-zero phase angle offset, between switching transistors of the first VR relative to the second VR, according to the determined phase angle and switching frequency combinations.

In some embodiments, the machine readable storage media of has one or more further instructions that when executed cause the one or more processors to perform an operation comprising: prior to providing the non-zero phase angle offset, adjust the phase angle and switching frequency to reduce power loss of the first and second power domains. In some embodiments, the non-zero phase angle offset is 180°. In some embodiments, the non-zero phase angle offset is programmable.

In another example, a system is provided which comprises: a memory; a processor coupled to the memory, the processor including an apparatus according to the apparatus described above; and a wireless interface for allowing the processor to communicate with another device.

In another example, a method is provided which comprises: extracting S-parameters for a first power domain powered by a first voltage regulator (VR) coupled to first one or more inductors, and a second power domain powered by a second VR coupled to second one or more inductors, wherein at least one of the first and second one or more inductors are mutually coupled; determining, for at least two operating voltages of the first and second power domains, phase angle and switching frequency combinations that meet ripple current targets; and providing a non-zero phase angle offset, between switching transistors of the first VR relative to the second VR, according to the determined phase angle and switching frequency combinations.

In some embodiments, the method comprises: prior to providing the non-zero phase angle offset, adjusting the phase angle and switching frequency to reduce power loss of the first and second power domains. In some embodiments, the non-zero phase angle offset is 180°. In some embodiments, the non-zero phase angle offset is programmable.

In another example, an apparatus is provided which comprises: means for extracting S-parameters for a first power domain powered by a first voltage regulator (VR) coupled to first one or more inductors, and a second power domain powered by a second VR coupled to second one or more inductors, wherein at least one of the first and second one or more inductors are mutually coupled; means for determining, for at least two operating voltages of the first and second power domains, phase angle and switching frequency combinations that meet ripple current targets; and means for providing a non-zero phase angle offset, between switching transistors of the first VR relative to the second VR, according to the determined phase angle and switching frequency combinations.

In some embodiments, the apparatus comprises: means for adjusting the phase angle and switching frequency to reduce power loss of the first and second power domains. In some embodiments, the non-zero phase angle offset is 180°. In some embodiments, the non-zero phase angle offset is programmable.

In another example, a system is provided which comprises: a memory; a processor coupled to the memory, the processor including apparatus according to the apparatus described above; and a wireless interface for allowing the processor to communicate with another device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
 a first one or more inductors which are associated with a first power domain, wherein the first power domain is to provide a first regulated power supply voltage and/or current for a first load; and a second one or more inductors, wherein at least one of the inductors of the first one or more inductors is inductively coupled to at least one of the inductors of the second one or more inductors, wherein the second one or more inductors are associated with a second power domain separate from the first power domain, and wherein the second power domain is to provide a second regulated power supply voltage and/or current for a second load.

2. The apparatus of claim 1 comprises a first voltage generator coupled to the first one or more inductors.

3. The apparatus of claim 2 comprises a second voltage generator coupled to the second one or more inductors.

4. The apparatus of claim 3, wherein the first voltage generator has a first clock, wherein the second voltage generator has a second clock, and wherein the first clock has a phase offset from a phase of the second clock.

5. The apparatus of claim 3, wherein the first voltage generator has a first switching frequency, wherein the second voltage generator has a second switching frequency, and wherein the first switching frequency is different from second switching frequency.

6. The apparatus of claim 1, wherein the first and second power domains are independent power domains.

7. The apparatus of claim 2, wherein the first and second one or more inductors are at least one of:
air core inductors (ACIs); or
magnetic core inductors (MCIs).

8. An apparatus comprising:
a system on chip (SOC) including a first processor core and a second processor core, wherein the first processor core is associated with a first power supply domain, and wherein the second processor core is associated with a second power supply domain separate from the first power supply domain;
a package coupled to the SOC via bumps;
a first one or more inductors adjacent to the package, wherein the first one or more inductors are associated with the first power domain; and
a second one or more inductors adjacent to the package, wherein the second one or more inductors are associated with the second power domain, wherein at least one of the inductors of the first one or more inductors is inductively coupled to at least one of the inductors of the second one or more inductors,
wherein the first power domain is to provide a first regulated power supply voltage and/or current for a first processor core, and wherein the second power domain is to provide a second regulated power supply voltage and/or current for a second processor core.

9. The apparatus of claim 8, wherein the first and/or second one or more inductors include one of:
air core inductors (ACIs);
magnetic core inductors (MCIs);
non-overlapping inductors;
partially over-lapping inductors; or
highly over-lapping inductors.

10. The apparatus of claim 8, wherein the SOC comprises a first voltage generator coupled to the first one or more inductors.

11. The apparatus of claim 10, wherein the SOC comprises a second voltage generator coupled to the second one or more inductors.

12. The apparatus of claim 11, wherein the first voltage generator has a first clock, wherein the second voltage generator has a second clock, and wherein the first clock has a phase offset from a phase of the second clock.

13. The apparatus of claim 11, wherein the first voltage generator has a first switching frequency, wherein the second voltage generator has a second switching frequency, and wherein the first switching frequency is different from second switching frequency.

14. The apparatus of claim 11, wherein the first and second power domains are independent power domains.

15. The apparatus of claim 11, wherein the first and/or second voltage generators includes one of:
a switching buck regulator;
a DC-DC converter;
a low-drop out regulator;
a Zener controlled transistor voltage regulator; or
a discrete transistor voltage regulator.

16. The apparatus of claim 8, wherein the SOC comprises:
a first current sensor to sense current of the first power supply domain;
a second current sensor to sense current of the second power supply domain; and
a controller to calculate powers of the first and second power supply domains, respectively, and total power of the apparatus,
wherein the controller is to adjust a non-zero phase angle offset according to the powers of the first and second power supply domains, respectively, and the total power during operation of the apparatus.

17. Non-transitory machine-readable storage media having one or more instructions that when executed cause one or more processors to perform an operation comprising:
extract first S-parameters for a first power supply domain powered by a first voltage generator coupled to a first one or more inductors;
extract second S-parameters for a second power supply domain powered by a second voltage generator coupled to a second one or more inductors, wherein at least one of the first and second one or more inductors are inductively coupled, and wherein the first and second power supply domains are separate; and
adjust one or more parameters of the first and/or second voltage generators according to the extracted first and second S-parameters.

18. The non-transitory machine-readable storage media of claim 17, having further one or more instructions that when executed cause the one or more processor to perform a further operation comprising:
determine combinations of phase angles and switching frequencies associated with the first and second voltage generators that meet ripple current targets for one or more operating conditions.

19. The non-transitory machine-readable storage media of claim 18, wherein the one or more parameters include the phase angles and switching frequencies of the first and second voltage generators, respectively, and wherein the machine-readable storage media comprises further one or more instructions that when executed cause the one or more processor to perform a further operation comprising:
provide a non-zero phase angle offset, between switchable transistors of the first voltage generator relative to the second voltage generator, according to the determined phase angle and switching frequency combinations.

20. The non-transitory machine-readable storage media of claim 19, comprises further one or more instructions that when executed cause the one or more processor to perform a further operation comprising:
  dynamically or statically offset the phase angle of one or more of the first and/or second power supply domains.

* * * * *